United States Patent
Pfirsch et al.

(10) Patent No.: US 7,541,260 B2
(45) Date of Patent: Jun. 2, 2009

(54) TRENCH DIFFUSION ISOLATION IN SEMICONDUCTOR DEVICES

(75) Inventors: Frank Pfirsch, Munich (DE); Walter Rieger, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/677,430

(22) Filed: Feb. 21, 2007

(65) Prior Publication Data

US 2008/0197405 A1 Aug. 21, 2008

(51) Int. Cl.
*H01L 21/76* (2006.01)

(52) U.S. Cl. .................. 438/451; 438/433; 438/449; 438/424; 438/E21.373

(58) Field of Classification Search ......... 438/434–435, 438/424–427, 418–420, 433, 449–451; 257/335–330, 257/E21.146, E21.149, E21.373
See application file for complete search history.

(56) References Cited

U.S. PATENT DOCUMENTS

| | | | |
|---|---|---|---|
| 6,103,578 A | * | 8/2000 | Uenishi et al. ............. 438/268 |
| 2004/0043565 A1 | | 3/2004 | Yamaguchi et al. |
| 2006/0205174 A1 | * | 9/2006 | Hshieh et al. ............. 438/435 |

* cited by examiner

*Primary Examiner*—Dung A. Le
(74) *Attorney, Agent, or Firm*—Schwegman, Lundberg & Woessner, P.A.

(57) ABSTRACT

A semiconductor structure is formed comprising a plurality of columns doped with alternating dopants. The columns are separated by trenches, and the dopant is diffused in the doped columns. The trenches are filled with semiconductor material. Other embodiments may be described and claimed.

12 Claims, 11 Drawing Sheets

TRENCH DIFFUSION ISOLATION IN SEMICONDUCTOR DEVICES

TECHNICAL FIELD

Various embodiments disclosed herein relate generally to power transistors including power transistors with trench diffusion isolation.

BACKGROUND

Field effect transistors (FETs) have become the most common building block for forming electronic circuits, and are commonly used as switches, amplifiers, and even to store data in some types of memory. Their use as switches in integrated circuits or electronic chips has enabled the rapid growth and high performance of common devices such as computers, cell phones, digital music players, and other digital electronics devices. Their use as switches also extends to higher power applications, such as automotive and industrial controls, communications equipment, and other applications requiring switching high voltages or currents.

FET devices for handling high power are often designed differently than the traditional FET devices used as switches in low power applications such as computerized circuits, as the structure of a typical FET device would not be able to handle the high voltages or currents without being destroyed. Destruction of a FET can occur through a variety of mechanisms, such as when the voltage between two terminals of the FET device exceeds the safe allowed voltage and reaches what is known as a breakdown voltage. The size of a FET device's components and the resistance of a FET device can also limit the current it is able to conduct or dissipate, which may effectively limit the voltage that can be applied.

Because power transistors often include features that extend relatively deep into the semiconductor substrate, forming power FET devices can also be challenging. Formation of many layers and many steps are often required simply to build a deep substrate region having the desired doped silicon properties for a power FET, adding to the challenge and expense of producing a commercially useful FET device.

Power FET devices will ideally have near zero power loss in the FET device itself, including low static power losses and low dynamic power loss. Static power losses occur when the device is in a conducting state, but the on-state resistance of the FET device is high enough to dissipate significant power. Low thermal impedance and reasonable thermal coefficients are also factors in static power loss when a device is operating at high voltage or current and its temperature begins to rise. Dynamic power losses occur when a transistor changes state, such as when the capacitance between two terminals of the FET such as between the gate and drain must be overcome for the FET device to switch states. The input signal capacitance at the gate and the output capacitance are both factors, as is reasonable freedom from charge recombination losses in the neighboring doped semiconductor regions of the FET.

These and other factors are considered in the design and manufacturing of power FET devices.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

Some embodiments of the invention comprise a method of forming a semiconductor device such as a power field effect transistor (FET), and power FET devices and other semiconductors formed by such methods. The method comprises forming a plurality of trenches in a semiconductor material such that the trenched semiconductor material comprises a plurality of columns. The columns are doped such that alternating adjacent columns are doped with alternating dopants, and the dopants in the doped columns are diffused. The trenches are filled with a semiconductor material, forming a solid semiconductor structure having alternating p-type doped and n-type doped columns. These columns are used in some embodiments to form power FET drift region and charge compensation regions, or to form other semiconductor devices.

Figure 1:
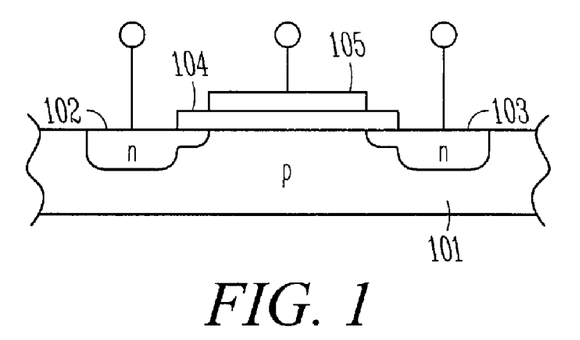
FIG. 1 is a cutaway side view of a field-effect transistor device (FET), consistent with the prior art.

FIG. 1 is a cutaway side view of a typical field effect transistor (FET), consistent with the prior art. A semiconductor substrate has a p-type region, such as a silicon substrate doped with boron, as shown at 101. Two n-type semiconductor regions are formed at 102 and 103, such as by ion implantation of a dopant such as phosphorus. These two regions are known as the source and the drain, as one region is used as the source of charge carriers conducted across the channel region of the substrate 101, while the other drains the conducted charge carriers. An insulating layer, such as a semiconductor oxide, is formed at 104, separating the channel region of the p-type substrate located between the source 102 and drain 103 from a metal or polysilicon gate 105. The gate is therefore electrically isolated from the source, drain, and channel region of the substrate, and influences conduction across the channel region between the source and drain by an electric field generated as a result of application of voltage to the gate 105.

With no voltage applied to the gate, the channel region of the substrate does not conduct, and essentially no electricity is able to flow between the source 102 and the drain 103. Even with application of increasingly large voltage across the source 102 and drain 103, only a small amount of leakage current is able to flow across the channel region unless an excessive voltage known as the breakdown voltage is applied across the source and the drain, and the transistor is destroyed. When a potential is applied to the gate and the source-drain voltage is small, the channel region acts like a resistor that varies in resistance with the applied gate voltage, enabling the FET to operate essentially as a voltage-controlled resistor. When larger voltages are applied across the source and drain, or when the gate voltage is relatively near the source or drain voltages, the FET will be turned almost completely on or off, acting more like a switch than a resistor as is common in digital electronic applications.

The FET structure of FIG. 1 is commonly used in electronic devices such as computer processors, cell phone and communications integrated circuits, and other digital logic devices. This structure is limited, however, in the amount of current it can conduct, and in the amount of voltage it can sustain between the various terminals of the FET device. For these and other reasons, a class of power FET devices has evolved having properties enabling the FET device to handle relatively large voltages and currents.

Figure 2:
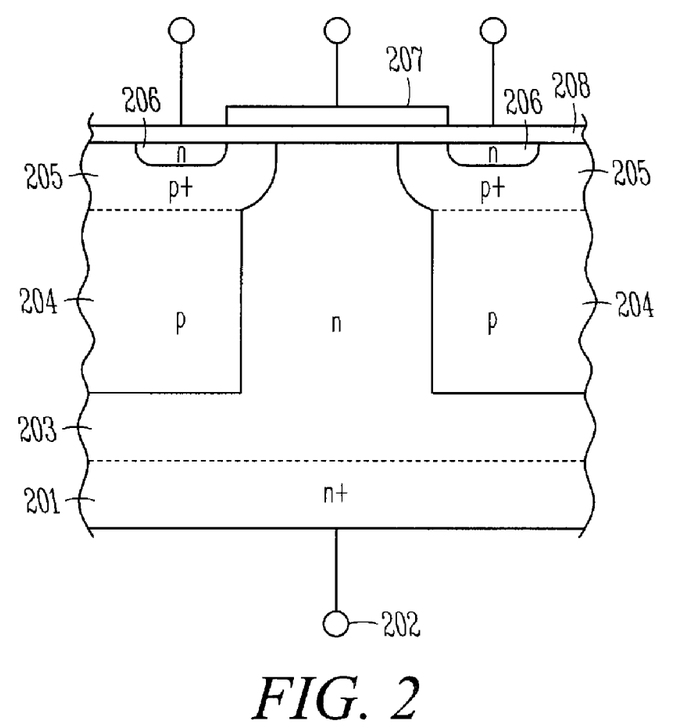
FIG. 2 is a cutaway side view of a power field-effect transistor having a charge compensation structure, as may be formed in an example embodiment of the invention

FIG. 2 illustrates one such power FET device, in cross-section cutaway view. A substrate 201 comprises silicon doped with an n-type material, and in this example is moderately or heavily doped with n-type material as denoted by the n+ symbol. The substrate material 201 is coupled to an electrical drain contact 202, which is used as the drain connection for the FET device. A layer of more lightly doped silicon 203 comprises a part of the n-type doped drain region and is built up on the more heavily doped substrate layer 201, and neighbors several charge compensation regions of p-type material 204. These p-type regions are coupled to more heavily doped p-type regions 205, which include the channel regions of the FET device. A series of n-type doped source regions 206 are formed isolated from the more lightly n-type doped drain region 203 by the p-type regions 205. A gate 204 is electrically insulated from the channel regions of p-type material 205 by an electric insulating layer such as silicon oxide 208.

In operation, a voltage difference is applied across the source regions 206 and drain regions 201 and 203. Changing the voltage applied to the gate 207 changes the carrier concentration in the channel region of the p-type material 205, causing it to either conduct or not to conduct. The FET device of FIG. 2 therefore operates on much the same principle as the FET device of FIG. 1, but features drain regions and p-type regions including the channel that are significantly different. The power FET of FIG. 2 also differs from the FET device of FIG. 1 in that two channel regions are shown, controlled by the same gate. In a typical power FET device, hundreds of thousands of devices similar to that illustrated in FIG. 2 are operated in parallel, such that all of their sources are electrically coupled, all of their drains are electrically coupled, and all of their gates are electrically coupled to form one large power FET device.

The power FET structure of FIG. 2 has other characteristics which make it well-suited to high power or high voltage switching. The drain region 203 is in other examples also called the drift region, and the breakdown voltage between the drain and gate is a function of the doping and thickness of the n-type epitaxial layer 203. The current capability is a function of the channel width of the p-type channel material 205, which can be effectively increased by using multiple devices as shown in FIG. 2 in parallel with one another. The structure of FIG. 2 when used in a parallel configuration therefore enables both higher voltage and higher current signal switching than is possible using a traditional lateral FET structure of FIG. 1.

The on-state resistance of the FET device is determined in part by the channel resistance, which is inversely proportional to the effective channel width. Using multiple devices in parallel improves the on-state resistance by increasing the effective channel width, making channel resistance a small part of the on-state resistance. The lightly doped n-type epitaxial layer 203 is also a significant source of on-state resistance, and a thick, lightly doped layer will have a higher resistance than a thin, heavily doped layer. The n-type epitaxial layer 203 remains lightly doped and relatively thick, however, so that is able to withstand blocking relatively high drain voltages without breaking down. Although the n-type epitaxial drift region's resistance can also be effectively reduced by using multiple transistor elements in parallel to form a large transistor, it remains in many examples the most significant contributor to on-state resistance.

The charge compensation region 204 of FIG. 2 is lightly p-type doped, and extends a significant depth along with the n-type drift region 203. This charge compensation region allows a higher doping for the drift region 203, resulting in a lower on-resistance than would be possible without the p-type region 204. The p and n-type doping of regions 203 and 204 are in some examples closely matched, to ensure a high off-state resistance and to enable the FET device to handle higher voltages. The drift regions 203 and the charge compensation regions 204 are often referred to as columns or as n- and p-columns, respectively, although the regions have different shapes and geometries in various embodiments.

The on-state resistance can also be reduced by using relatively narrow p-type regions 204 and n-type regions 203, such that there is a small pitch between the alternating p-type and n-type doped semiconductor columns. While this is a desirable geometric feature, it is limited in many embodiments by the dopant diffusion process used to form the p-type regions 204 as the device of FIG. 2 is built.

Figure 3:
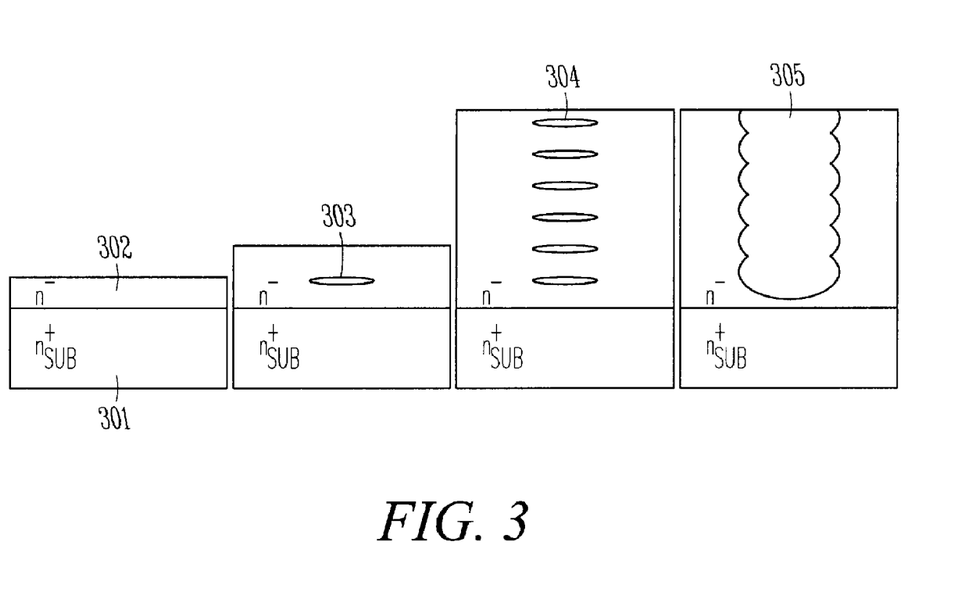
FIG. 3 illustrates an example method of forming doped silicon column structures, consistent with the prior art.

FIG. 3 illustrates an example method of forming a p-type charge compensation structure such as is shown at 204 of FIG. 2, consistent with the prior art. At 302, the more heavily-doped n-type substrate 301 has a more lightly doped layer of n-type material formed thereon. A p-type material is implanted as shown at 303, either before or after another layer of n-type material is added. This process continues for several layers, so that a structure having a series of vertically aligned p-type implant regions is formed as shown at 304. The structure is then diffused such as by exposing it to heat, resulting in diffusion of the p-type dopant into surrounding n-type material to produce the structure shown at 305. The resulting structure 305 is a continuous p-type column of approximately 30-40 micrometers in this example. This column structure can then be used as the charge compensation structure 204 of FIG. 2, while the space to either side of the charge compensation structure makes up the epitaxial drift region 203 that serves as an extension of the drain.

The column pitch that can be obtained using a process such as that of FIG. 3 is limited in that diffusion of the p-type implantation regions 303 and 304 not only vertically connects one implanted region to another but causes the implanted region to diffuse sideways, thereby limiting the pitch between columns. The pitch of charge compensation regions is effectively limited to values greater than approximately twice the vertical distance between implantation layers 303 in some embodiments. A greater number of individual implantation layers 303 can be used to control the pitch somewhat, but this dramatically increases the number of steps in power FET device production and increases the cost without fully solving the lateral diffusion problem. This effectively creates a minimum practical column pitch, limiting the designer's ability to reduce on-state resistance of the power FET device.

Some embodiments of the invention seek to remedy this by providing alternate ways of forming columns such as the p-type charge compensation region 204 and the n-type epitaxial drift region 203 of FIG. 2. One such example is shown in FIG. 4, which illustrates production of doped silicon columns such as may be used to form a charge compensated power FET device, consistent with some embodiments of the invention. A more heavily doped n-type substrate 401 is used as a base to form a series of epitaxial silicon layers 402, each layer except the top layer implanted with alternating regions of p-type material 403 and n-type material 404. The resulting structure of FIG. 4A somewhat resembles that shown at 304 of FIG. 3, except that fewer layers are needed and the epitaxial silicon is not already doped with n-type material so is doped in layers as shown at 404.

Figure 4A:
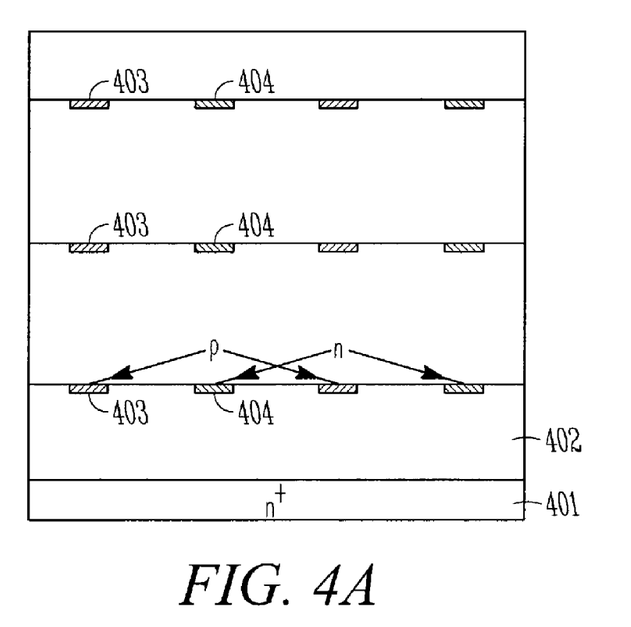
FIGS. 4A-4G illustrate a method of forming doped silicon columns for a semiconductor device using trenches, consistent with an example embodiment of the invention.
Figure 4B:
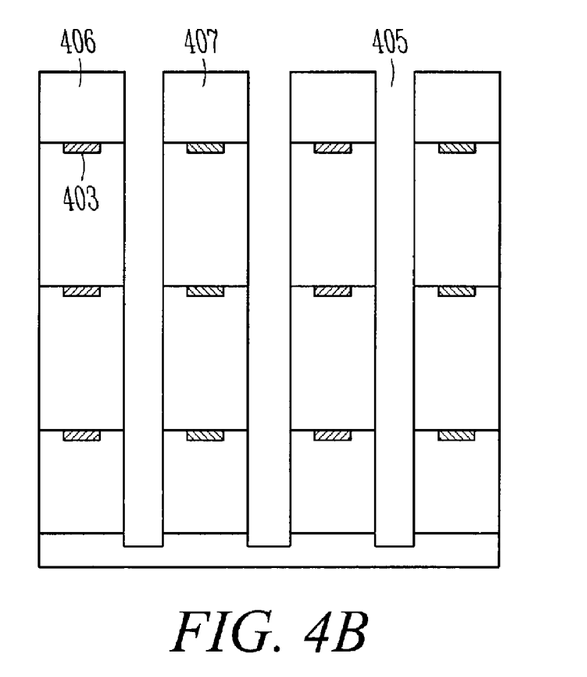

In FIG. 4B, a series of trenches 405 are formed in the structure of FIG. 4A, separating the n-type doped regions and the p-type doped regions into separate columns. In this example, the trenches extend down into the more heavily doped n-type material, but in other examples the trenches will not extend into the more heavily doped substrate. In an alternate embodiment, the epitaxial silicon layers 402 of FIG. 4A are doped such as with an n-type material and only p-type material 403 is added as the layers are formed, so that the p-type columns in FIG. 4B contain a series of implanted regions 403 but the alternate columns 407 comprise relatively uniformly n-type doped silicon.

Figure 4C:
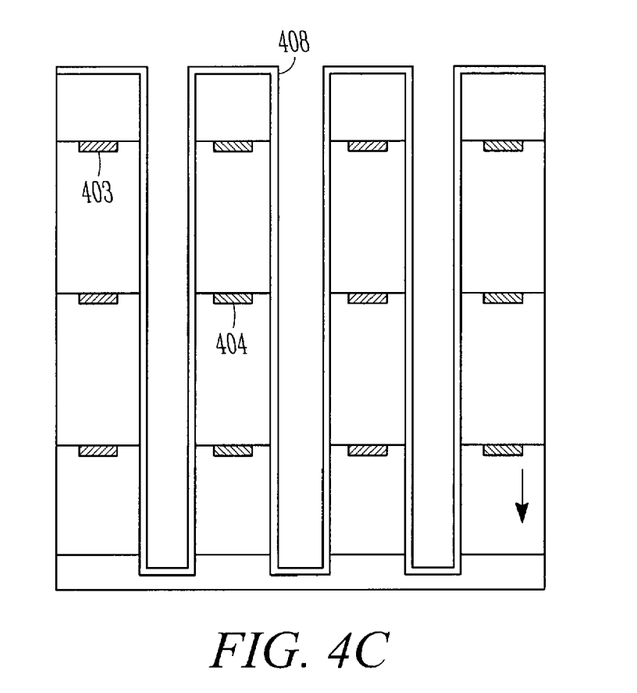

In FIG. 4C, a protective layer 408 is applied over the exposed surfaces of the structure of FIG. 4B, such as by oxidizing the exposed silicon to create silicon oxide or by formation of silicon nitride or another suitable material. The structure of FIG. 4C is then exposed to heat, or is otherwise treated such that the p-type implant material 403 and the n-type implant material 404 diffuses into the surrounding silicon. In an alternate embodiment, no protective layer is applied in this step.

Figure 4D:
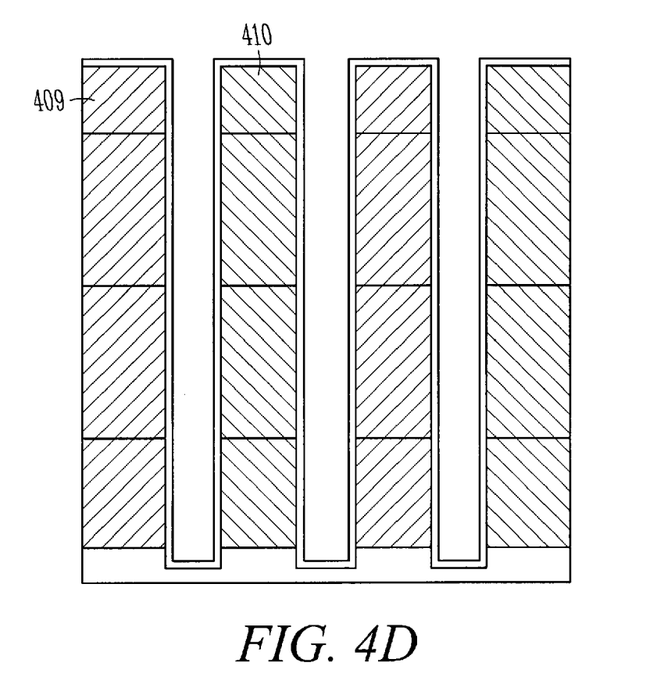

In various examples, the resulting structure is shown in FIG. 4D, after the implanted dopant material has diffused from a few micrometers up to approximately ten micrometers in each direction from its implantation site. The resulting structure contains both p-type columns 409 and n-type columns 410 that are relatively uniformly doped, and that can be formed relatively near each other.

Figure 4E:
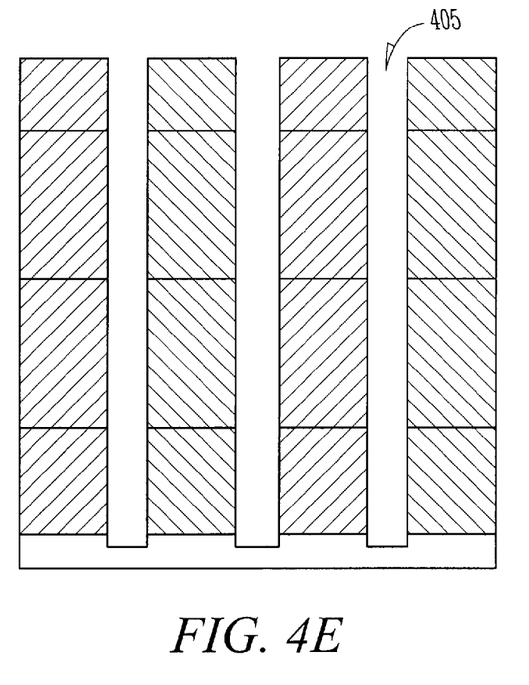
Figure 4F:
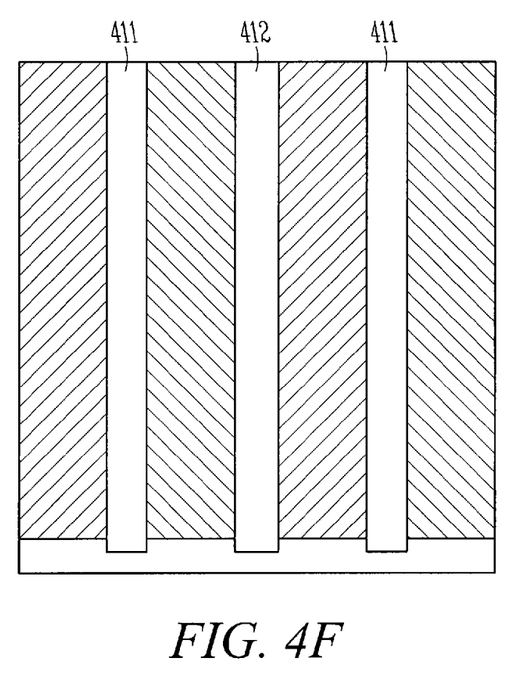

When the protective layer 408 is removed, the resulting structure of FIG. 4E has trenches 405 formed between p-type columns 409 and n-type columns 410, and the columns 409 and 410 are not insulated from the trenches by the protective oxide or other insulator material. The trenches are then filled with an undoped or lightly doped silicon at FIG. 4F. In some embodiments, the silicon is doped but is alternately doped, such as by filling trenches 411 with p-type doped silicon and filling trenches 412 with n-type doped silicon. The resulting doped silicon columns are in this example from 10 to 40 micrometers tall, enabling a power FET device to withstand from 100 to 600 volts applied to the drain. The pitch from the edge of one p-type doped column to the same edge of the next p-type doped column is approximately four to 15 micrometers, resulting in a device that has a very low on-resistance in addition to its high voltage capability. In particular, the pitch from the edge of one p-type doped column to the same edge of the next p-type doped column is not constrained by the vertical distance between implanted regions 403, thereby enabling a pitch of the order of this vertical distance or less.

Figure 4G:
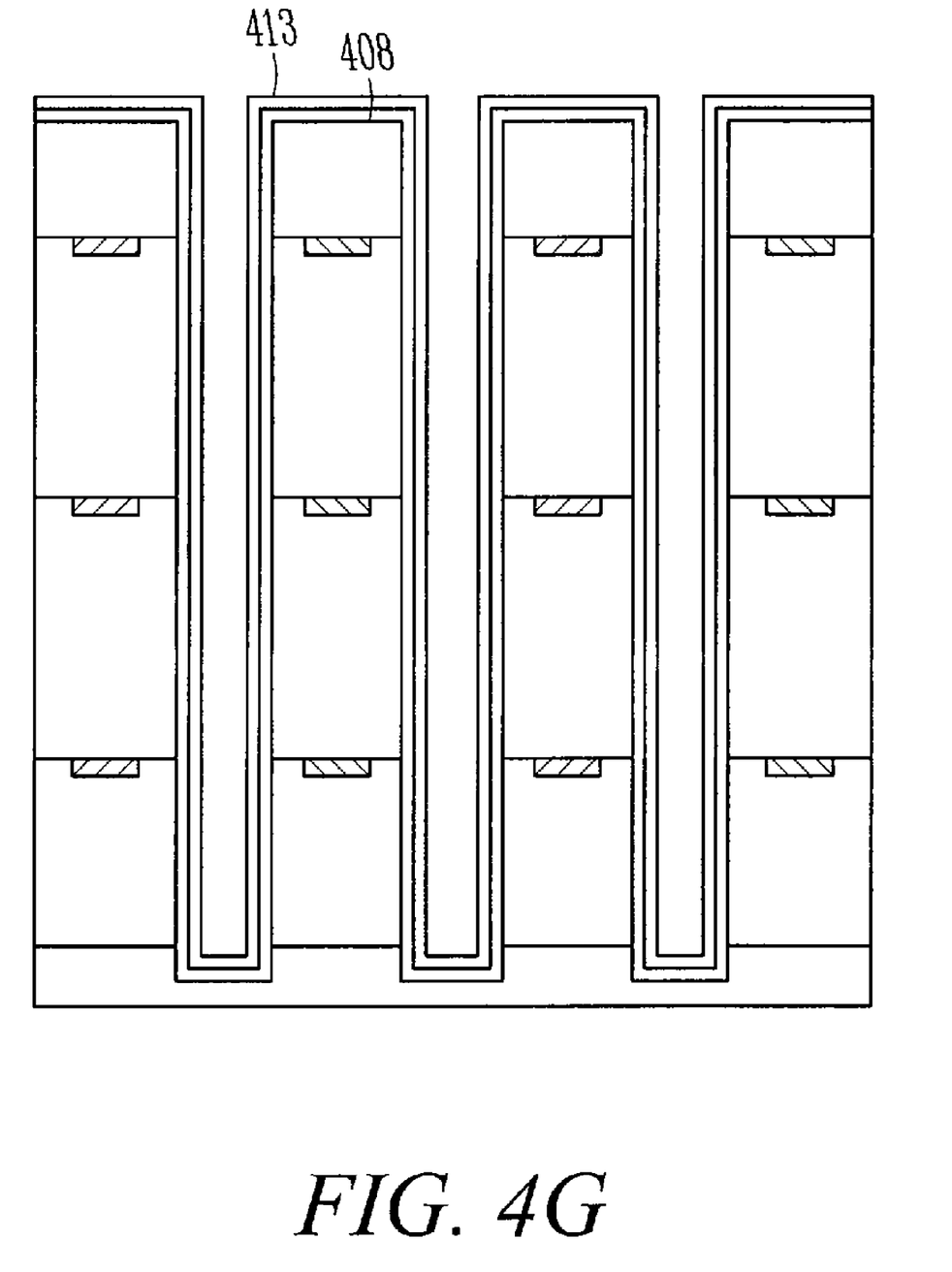

FIG. 4G illustrates another alternate embodiment to FIG. 4C, in which the exposed surfaces of the trenches in the doped silicon columns are covered with a protective layer 408 such as silicon oxide and additionally with a further outdiffusion inhibiting layer 413 such as polysilicon or silicon nitride, which are removed after the diffusion process to form the structure of FIG. 4E. In yet other embodiments, the trenches can also be filled completely with an insulator in step 4C that is not removed later, and can be used to form a variety of semiconductor devices including FET devices, insulated gate bipolar transistors (IGBTs), diodes, and other semiconductor devices.

FIG. 5 illustrates embodiments of method and structure for producing columns of doped silicon as may be used to form devices such as power FETs, consistent with an example embodiment of the invention. FIG. 5A illustrates a more heavily doped n-type semiconductor substrate 501 with a less heavily doped layer of n-type material 502 built up on the substrate. In some embodiments, the semiconductor material 502 is not doped. A series of trenches 503 are etched or otherwise formed into the semiconductor material, and are in this example approximately one to three micrometers wide and ten or more micrometers deep. The trenches are desirably narrow, but are limited in some embodiments by the desired depth of the trenches and the available etching technology.

Figure 5A:
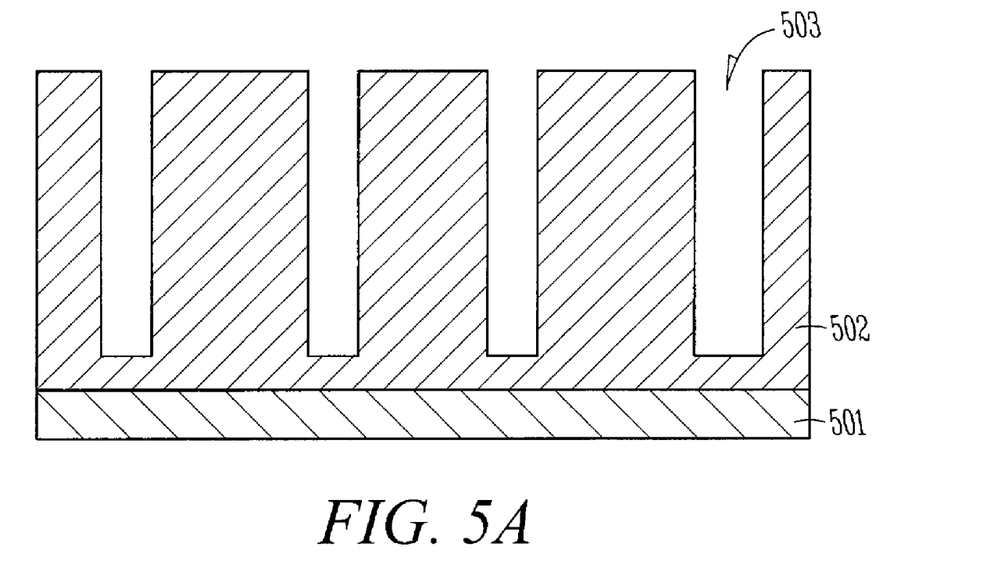
FIG. 5A-5I illustrate an alternate method of forming doped silicon columns for a semiconductor device using trenches, consistent with an example embodiment of the invention.
Figure 5B:
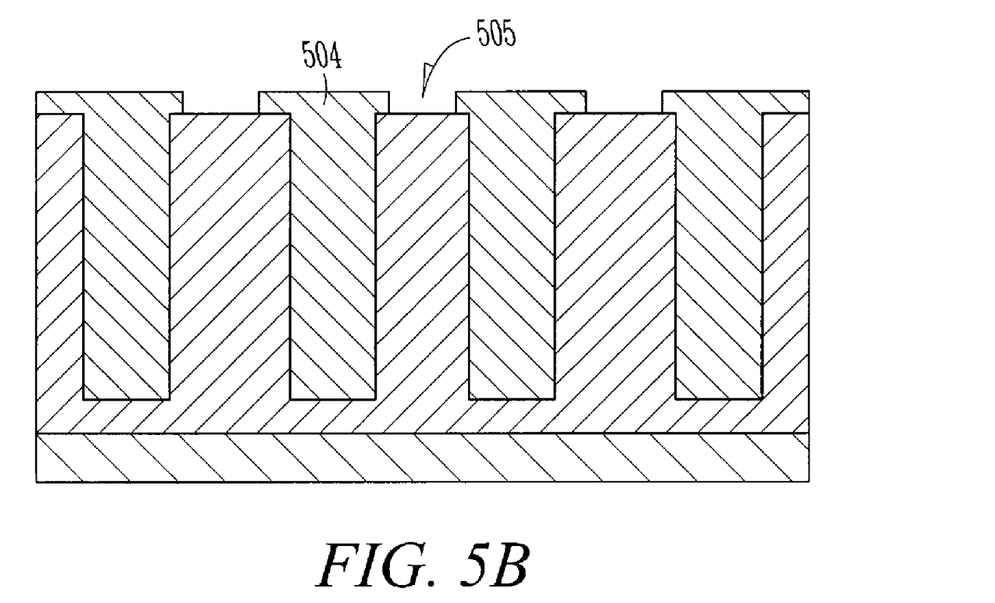
Figure 5C:
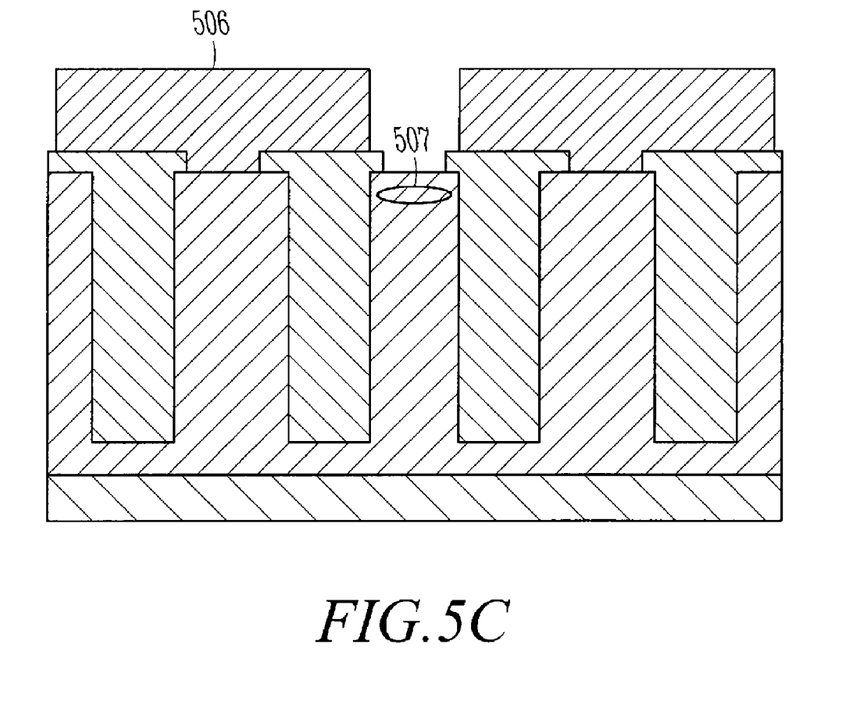

In FIG. 5B, the trenches are filled with a hard mask material, with openings 505 in the mask material that are desirably uniform to ensure uniform doping in subsequent steps. In FIG. 5C, the hard mask structures or parts of the hard mask structures and every second opening in the hard mask structures is covered with a resist material 506 using a photolithographic technology. A dopant is applied through the opening in the hard mask layer and the resist layer, such that alternating undoped semiconductor columns receive the p-type dopant 507.

Figure 5D:
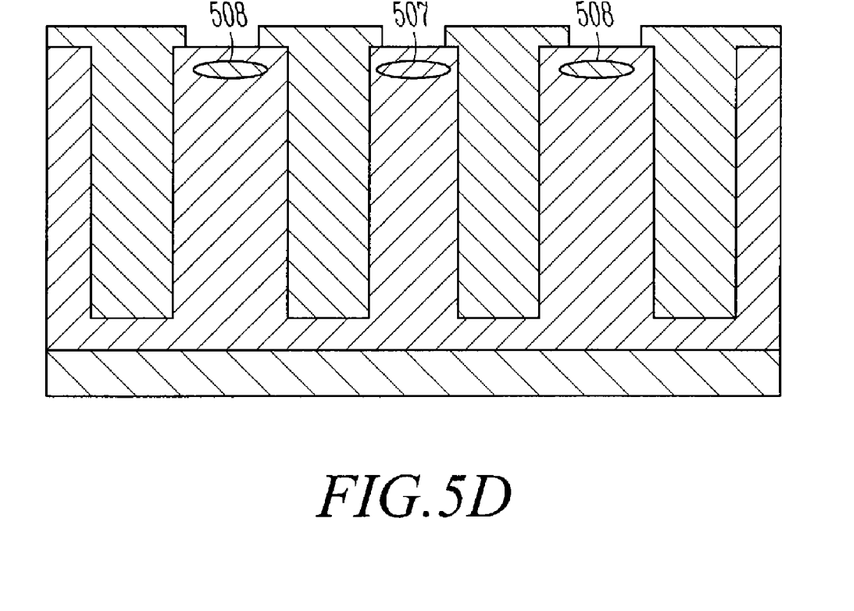

The resist layer is then removed and reapplied covering the doped columns and exposing the semiconductor columns that are not yet doped, and they are doped with an n-type material. This is illustrated in FIG. 5D, which shows alternating n-type dopant 508 and p-type dopant 507. The dopants are in some embodiments implanted using different energies to achieve a high dopant concentration distributed through a range of depths, but in some embodiments are limited by the mask material and other factors.

Figure 5E:
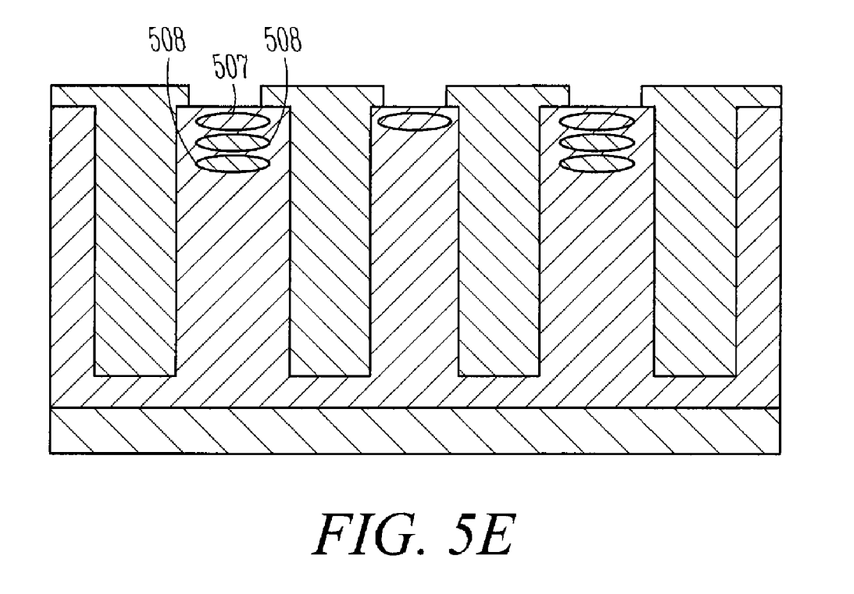
Figure 5F:
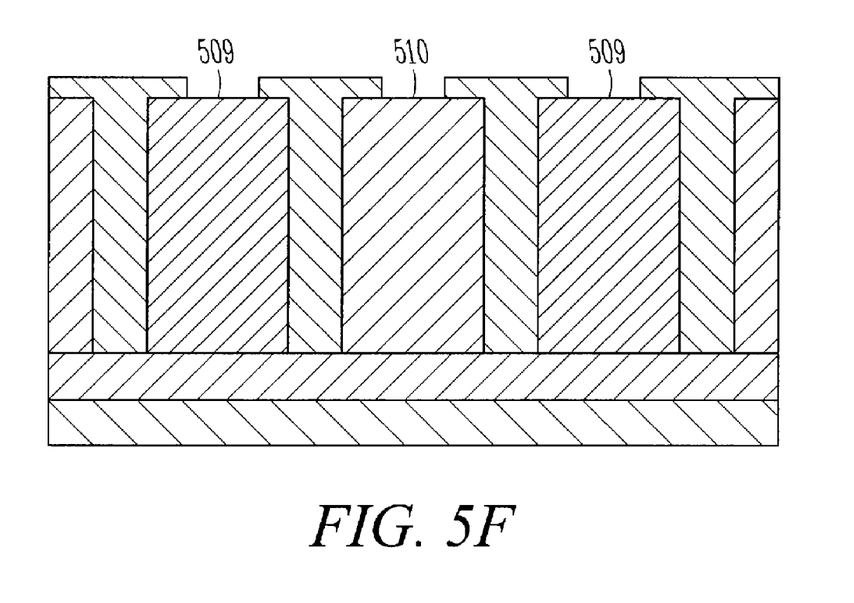

In an alternate embodiment shown in FIG. 5E, only one resist mask layer is used to apply a first type of dopant such as the n-type dopant 508, which is applied relatively heavily. The p-type dopant 507 is then applied to each of the columns in a lower concentration, such that when the dopant is diffused such as by exposing the assembly to heat, the resulting structure of FIG. 5F is produced. Diffusion in some embodiments takes a significant amount of time, such as a day in one example to diffuse the implanted dopants a distance of ten or more micrometers to form a FET device having a breakdown voltage of 200 volts. This structure has a series of alternating n-type doped semiconductor columns 509, and a series of p-type doped semiconductor columns 510.

Figure 5G:
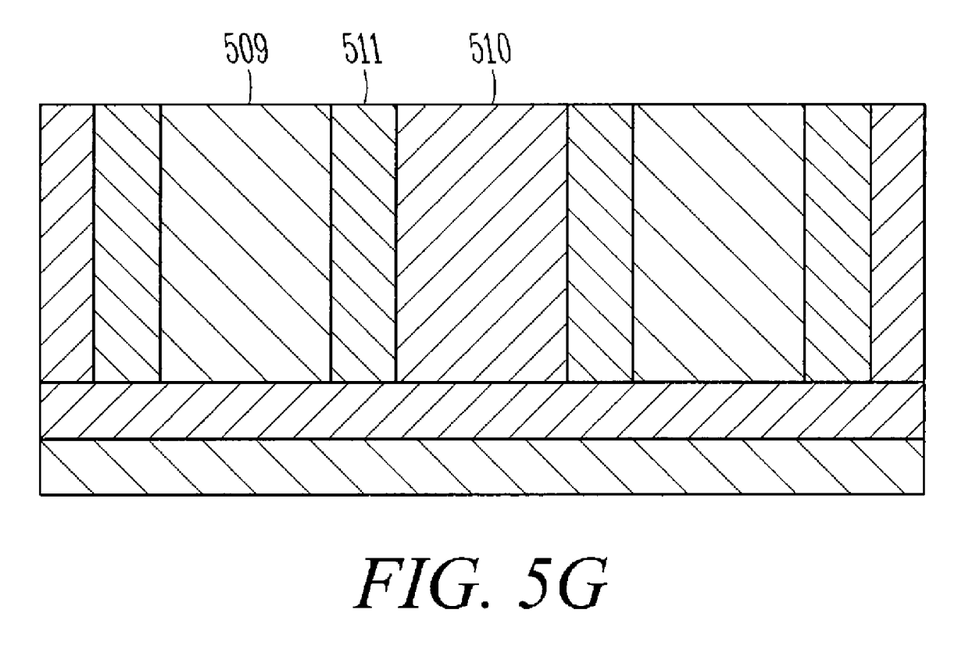
Figure 5H:
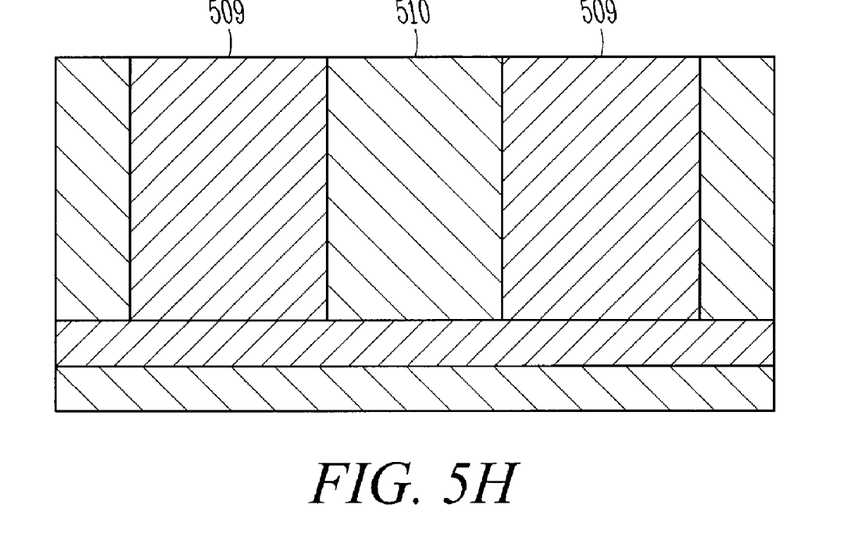

The oxide hard mask is removed from the assembly of FIG. 5F such as by using a chemical etch. The trenches 503 are filled with either undoped or doped epitaxial silicon or another semiconductor material, resulting in the assembly shown in FIG. 5G. The structure has a series of alternating n-type doped semiconductor columns 509 and p-type doped semiconductor columns 510, with the trenches 503 filled with semiconductor material. The assembly of FIG. 5G is then heat diffused again, such that the dopant in n-type semiconductor columns 509 and p-type semiconductor columns 510 diffuses into the semiconductor fill material 511, resulting in the wider n-type columns 509 and p-type columns 510 as shown in FIG. 5H.

Figure 5I:
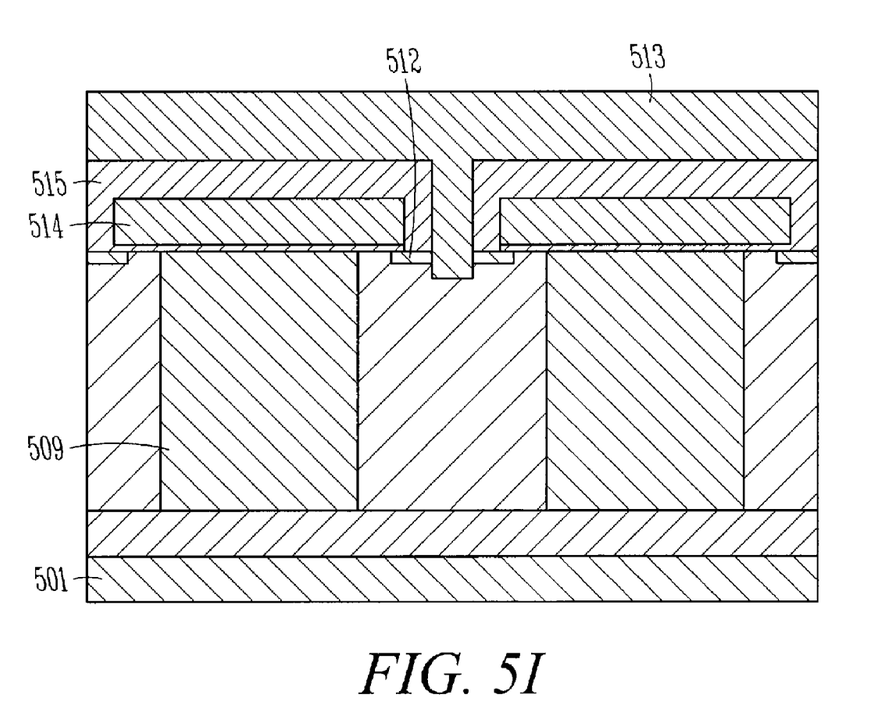

The resulting alternating columns of n-type and p-type semiconductor material are used to form a semiconductor device, such as is shown in FIG. 5I. The FET device illustrated here includes a heavily doped n-type drain region 501, a series of more lightly doped n-type drift regions 509, a series of n-type source regions 512 coupled to a source contact metal layer 513, and gate polysilicon 514 embedded in an insulator such as silicon oxide 515. The resulting FET device is substantially similar to the FET device shown in FIG. 2, and in a further embodiment is formed such that thousands of transistor devices as shown in FIG. 5I are formed on the same substrate and are coupled in parallel. This results in a FET device having a very high current conduction capability, and a low on-state resistance and high voltage tolerance.

The examples presented here have illustrated how a FET device such as that of FIG. 2 or other semiconductor devices can be formed using a series of alternating doped silicon columns, and how the columns can be formed using trenches to produce a smaller column pitch than is possible using other technologies. Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A method of forming a semiconductor device, comprising:
    forming a plurality of trenches in a semiconductor material such that the trenched semiconductor material comprises a plurality of columns;
    doping the columns such that alternating adjacent columns are doped with alternating dopants;
    diffusing the dopant in the doped columns; and
    filling the trenches.

2. The method of forming a semiconductor device of claim 1, wherein filling the trenches comprises filling the trenches with a semiconductor material.

3. The method of forming a semiconductor device of claim 1, wherein filling the trenches comprises filling the trenches with an insulating material.

4. The method of forming a semiconductor device of claim 1, wherein forming a plurality of trenches comprises etching the trenches.

5. The method of forming a semiconductor device of claim 1, wherein the depth of the trenches is at least as large as the pitch between columns doped with the same dopant.

6. The method of forming a semiconductor device of claim 1, wherein diffusing the dopant in the doped columns occurs while the trenches are unfilled.

7. The method of forming a semiconductor device of claim 1, further comprising covering the doped columns with a protective material, and wherein diffusing the dopant in the doped columns occurs while the columns are covered.

8. The method of forming a semiconductor device of claim 1, further comprising building up the semiconductor material in layers, and wherein doping the columns comprises doping the layers as they are built up.

9. The method of forming a semiconductor device of claim 1, wherein doping the columns comprises masking alternating columns before applying dopant to the columns not masked.

10. The method of forming a semiconductor device of claim 1, wherein the alternating dopants in the alternating doped adjacent columns comprise n-type and p-type dopants.

11. The method of forming a semiconductor device of claim 10, wherein the n-type doped columns comprise drift regions of a power FET device drain and p-type doped columns comprise charge compensation regions of the power FET device.

12. The method of forming a semiconductor device of claim 1, wherein the semiconductor material comprises semiconductor material formed on a doped substrate.

* * * * *